(12) United States Patent
Gou et al.

(10) Patent No.: US 10,314,181 B2
(45) Date of Patent: Jun. 4, 2019

(54) DISPLAY SCREEN ASSEMBLY AND DISPLAY DEVICE HAVING THE SAME

(71) Applicant: LEYARD OPTOELECTRONIC CO., LTD., Beijing (CN)

(72) Inventors: Jianzhou Gou, Beijing (CN); Xuechao Sun, Beijing (CN); Yu Zhao, Beijing (CN)

(73) Assignee: LEYARD OPTOELECTRONIC CO., LTD., Beijing (CN)

( * ) Notice: Subject to any disclaimer, the term of this patent is extended or adjusted under 35 U.S.C. 154(b) by 160 days.

(21) Appl. No.: 15/247,093

(22) Filed: Aug. 25, 2016

(65) Prior Publication Data

US 2017/0202098 A1 Jul. 13, 2017

(30) Foreign Application Priority Data

Jan. 12, 2016 (CN) .......................... 2016 1 0019317

(51) Int. Cl.
*G09F 9/33* (2006.01)
*H05K 5/00* (2006.01)
*H05K 5/02* (2006.01)
*G02F 1/1335* (2006.01)

(52) U.S. Cl.
CPC ......... *H05K 5/0021* (2013.01); *G02F 1/1335* (2013.01); *G09F 9/33* (2013.01); *H05K 5/0204* (2013.01); *H05K 5/0208* (2013.01)

(58) Field of Classification Search
CPC .. H05K 5/0021; H05K 5/0204; H05K 5/0208; G02F 1/1335; G09F 9/33
See application file for complete search history.

(56) References Cited

U.S. PATENT DOCUMENTS

| 9,845,816 | B2 * | 12/2017 | Brashnyk | G09F 9/3026 |
| 2017/0006727 | A1 * | 1/2017 | Ryu | H01L 25/0753 |
| 2017/0202097 | A1 * | 7/2017 | Lee | G09F 7/18 |
| 2018/0213657 | A1 * | 7/2018 | Drabant | H05K 5/0021 |

FOREIGN PATENT DOCUMENTS

| CN | 103337224 | | 10/2013 | | |
| CN | 103337224 | A * | 10/2013 | .......... | G09F 9/3026 |
| CN | 103337224 | A * | 10/2013 | .......... | G09F 9/3026 |
| CN | 104112403 | A * | 10/2014 | | |
| CN | 104112403 | A * | 10/2014 | | |
| CN | 105023523 | A * | 11/2015 | | |
| CN | 105023523 | A * | 11/2015 | | |
| JP | 2002-030784 | A | 1/2002 | | |
| JP | 2007-248498 | A | 9/2007 | | |
| JP | U 3193153 | | 8/2014 | | |
| JP | 2015 210429 | A | 11/2015 | | |
| WO | WO 2014172848 | A1 * | 10/2014 | .............. | G09F 9/33 |
| WO | WO-2014172848 | A1 * | 10/2014 | .............. | G09F 9/33 |

OTHER PUBLICATIONS

Office Action for Japanese Patent Application No. 10-2015-7036952, dated Sep. 4, 2017.

\* cited by examiner

*Primary Examiner* — Nidhi Thaker
(74) *Attorney, Agent, or Firm* — Pearl Cohen Zedek Latzer Baratz LLP

(57) ABSTRACT

The invention provides a display screen assembly and a display device having the same. The display screen assembly includes a lamp panel (10) and a reverse electromagnet (21) provided at a rear side of the lamp panel (10). The technical solution of the invention effectively solves the problem in the prior art that a display screen assembly is difficult to dismount.

16 Claims, 3 Drawing Sheets

DISPLAY SCREEN ASSEMBLY AND DISPLAY DEVICE HAVING THE SAME

TECHNICAL FIELD OF THE INVENTION

The invention relates to the technical field of display devices, and in particular to a display screen assembly and a display device having the same.

BACKGROUND OF THE INVENTION

Due to the incomparable advantages of ultra-high definition display, high brightness, low power consumption, long service life and the like compared to a traditional display device such as a liquid crystal screen and a projector, a Light-Emitting Diode (LED) display screen becomes a new favourite of the current field of display, and is widely applied to occasions such as meeting rooms, clubs, shopping malls, studios and monitoring halls. Due to the advantages of small occupied space, convenient maintenance, high environmental adaptability and the like, a front-maintained LED display screen is more and more preferred by people in the field of LED display. When this display screen is maintained, a maintainer usually needs to take down a whole display unit including an LED module, a power supply and the like from a front of the display screen for maintenance.

The front-maintained LED display screen is mainly maintained from the front using two tools at present as follows. One tool is a specially-made barb tool. When the display screen is maintained, it is necessary to carefully tear off face masks at four corners on a surface of a lamp panel using tweezers or a blade, and then an LED lamp panel is hooked out using the specially-made barb tool through square holes reserved in four corners of a box and maintained. The maintenance mode is complex in process, high in maintenance difficulty and high in cost, the display effect of the display screen will be adversely affected after the face masks are replaced, the face masks in the front of the display screen and lamp beads on a display panel are easily destroyed using the barb tool.

The other tool is a pure strongly-magnetic tool. An iron sheet will be provided behind each display unit of the display screen in this maintenance mode so as to be fit to the strongly-magnetic tool. Based on a principle that a magnetic force between the strongly-magnetic tool and the iron sheets is greater than the magnetic force of an adopted permanent magnet, LED display units are forcibly pulled down from a frame structure so as to achieve maintenance. This maintenance mode easily causes a series of problems such as disengagement of LED lamp beads, damage to the face masks and deformation of a Printed Circuit Board (PCB), and is high in maintenance cost and low in maintenance efficiency.

SUMMARY OF THE INVENTION

A main objective of the invention is to provide a display screen and a display device having same, which are intended to solve the problem in the traditional art that a display screen assembly is difficult to maintain from the front.

To this end, according to one aspect of the invention, a display screen assembly is provided, which comprises: a lamp panel and a reverse electromagnet provided at a rear side of the lamp panel.

Furthermore, the display screen assembly further comprises a fixed frame, the lamp panel and the reverse electromagnet are provided on the fixed frame separately, and the lamp panel and the reverse electromagnet are provided at two opposite sides of the fixed frame respectively.

Furthermore, an operation hole running through the lamp panel is provided on the lamp panel, such that an operation piece penetrating through the operation hole can be connected with the reverse electromagnet via a wire, thereby controlling whether the reverse electromagnet is magnetic.

Furthermore, the display screen assembly further comprises a plug connector provided at a position, corresponding to the operation hole, on the lamp panel, the wire is connected with the plug connector.

Furthermore, the fixed frame is rectangular, there are four reverse electromagnets, and the four reverse electromagnets are provided at four corners of the fixed frame respectively.

Furthermore, the display screen assembly further comprises a first ferromagnet provided at the rear side of the lamp panel.

Furthermore, the first ferromagnet is provided on the fixed frame and is located between the fixed frame and the lamp panel.

Furthermore, the first ferromagnet is provided in the geometric centre of the lamp panel.

Furthermore, the first ferromagnet is made from soft iron.

Furthermore, the display screen assembly further comprises: a safety pin, the safety pin comprising a rod body and a stop portion provided at a first end of the rod body, and a second end of the rod body is connected with the fixed frame; and a positioning pin, a first end of the positioning pin is connected with the fixed frame, and a second end of the positioning pin is conical structurally, a length of the safety pin is longer than a length of the positioning pin.

Furthermore, the length of the safety pin is greater than a thickness sum of the lamp panel and the fixed frame.

Furthermore, there are a plurality of positioning pins.

According to another aspect of the invention, a display device is provided, which comprises: a support and a display screen assembly connected with the support, the display screen assembly is the above display screen assembly, and a second ferromagnet corresponding to the reverse electromagnet is provided on the support.

Furthermore, the display screen assembly is the above display screen assembly, and the support further comprises: a safety pin hole, the safety pin hole comprising a first hole and a second hole connected with each other, the first hole is provided at a lower side of the second hole, the first hole is adaptive to a rod body of the display screen assembly and stops the passage of a stop portion of the display screen assembly, and the second hole is capable of allowing the passage of the stop portion of the display screen assembly; and a positioning pin hole, the positioning pin hole is adaptive to a positioning pin of the display screen assembly.

Furthermore, the second ferromagnet is made from iron.

By applying the technical solution of the invention, the reverse electromagnet is provided at the rear side of a lamp panel, the reverse electromagnet is magnetic, and therefore a display screen assembly can be fixed by virtue of magnetic attraction of the reverse electromagnet instead of other fasteners. When the reverse electromagnet is energized, the magnetism of the reverse electromagnet disappears, and the display screen assembly is separated from a rear support accordingly. The technical solution of the invention effectively solves the problem that the display screen assembly is difficult to maintain from the front.

BRIEF DESCRIPTION OF THE DRAWINGS

The drawings of the specification, forming a part of the invention, are used to provide further understanding of the invention. The schematic embodiments and illustrations of the invention are used to explain the invention, and do not form improper limits to the invention. In the drawings.

Wherein, the drawings include the following drawing marks:

10, lamp panel; 11, operation hole; 20, fixed frame; 21, reverse electromagnet; 22, safety pin; 221, rod body; 222, stop portion; 23, positioning pin; 24, first ferromagnet; 30, support; 31, safety pin hole; 32, positioning pin hole; and 40, rear cover.

DETAILED DESCRIPTION OF THE EMBODIMENTS

It is important to note that the embodiments of the invention and the characteristics in the embodiments can be combined under the condition of no conflicts. The invention will be illustrated below with reference to the drawings and the embodiments in detail.

Figure 1:
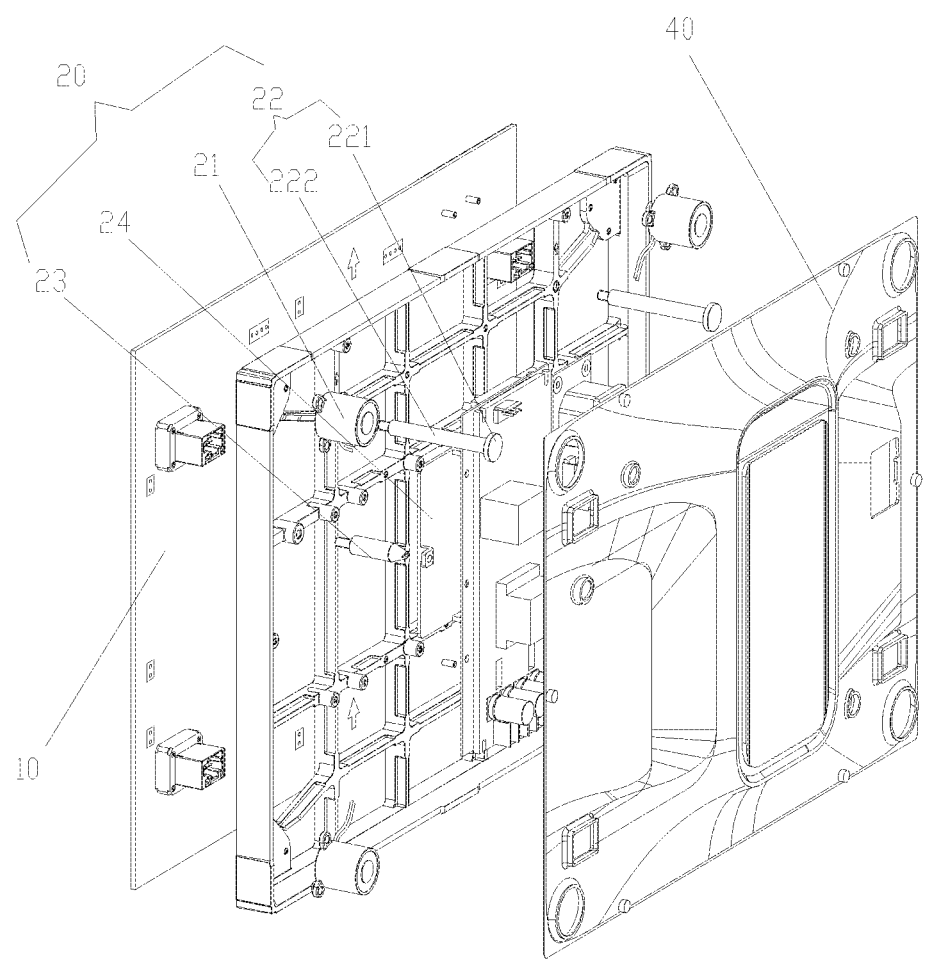
FIG. 1 shows a structural diagram of an embodiment for a display screen assembly according to the invention.

As shown in FIG. 1, a display screen assembly of the present embodiment comprises: a lamp panel 10 and a reverse electromagnet 21 provided at a rear side of the lamp panel 10.

By applying the technical solution of the present embodiment, the reverse electromagnet 21 is provided at the rear side of the lamp panel 10, the reverse electromagnet 21 is magnetic, and therefore the display screen assembly can be fixed by virtue of magnetic attraction of the reverse electromagnet 21 instead of other fasteners. When the reverse electromagnet is energized, the magnetism of the reverse electromagnet 21 disappears, and the display screen assembly is separated from a rear support accordingly. The technical solution of the present embodiment effectively solves the problem that the display screen assembly is difficult to maintain from the front.

Figure 2:
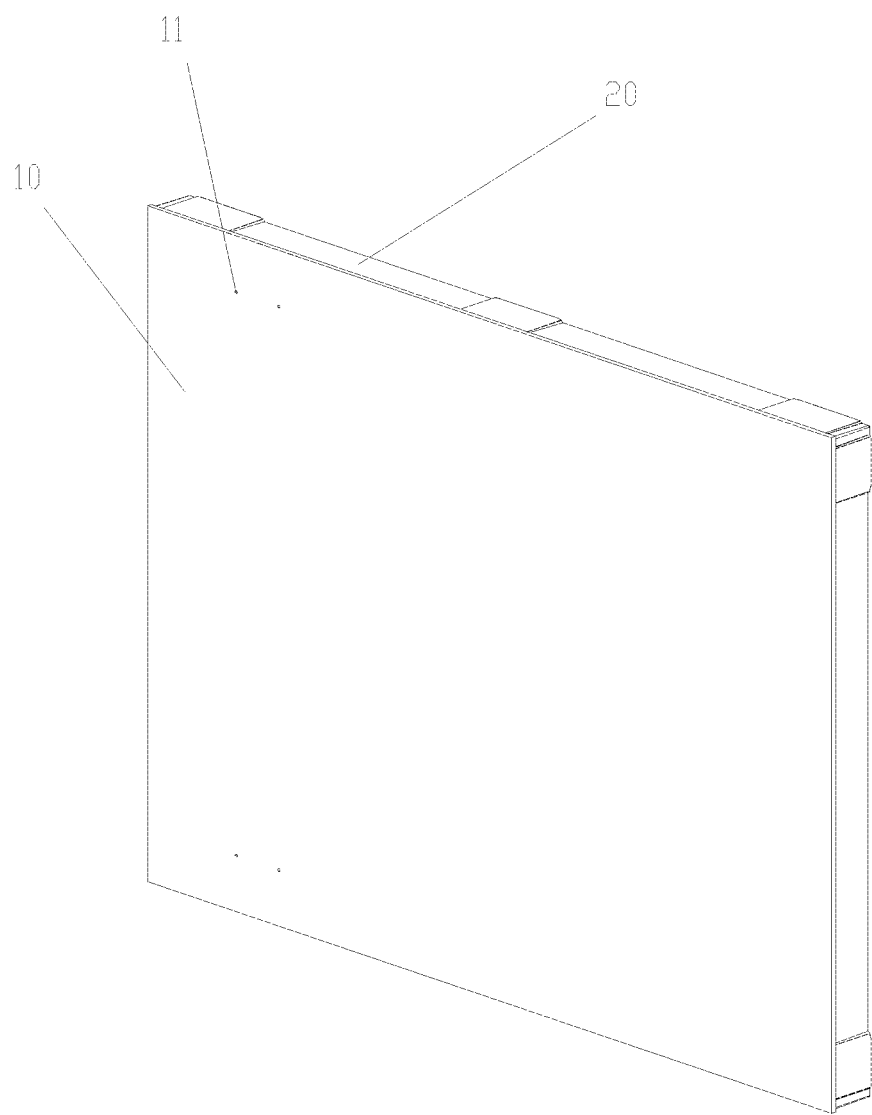
FIG. 2 shows a structural diagram of a lamp panel of a display screen assembly in FIG. 1.

As shown in FIG. 1 and FIG. 2, in the technical solution of the present embodiment, the display screen assembly further comprises a fixed frame 20, the lamp panel 10 and the reverse electromagnet 21 is provided on the fixed frame 20 separately, and the lamp panel 10 and the reverse electromagnet 21 are provided at two opposite sides of the fixed frame 20 respectively. The above structure enables, on one hand, the lamp panel 10 to be more steadily fixed without easy deformation, and isolates, on the other hand, the lamp panel 10 from the reverse electromagnet by the fixed frame 20, thereby avoiding interference of the reverse electromagnet 21 to electronic components on the lamp panel 10.

Figure 3:
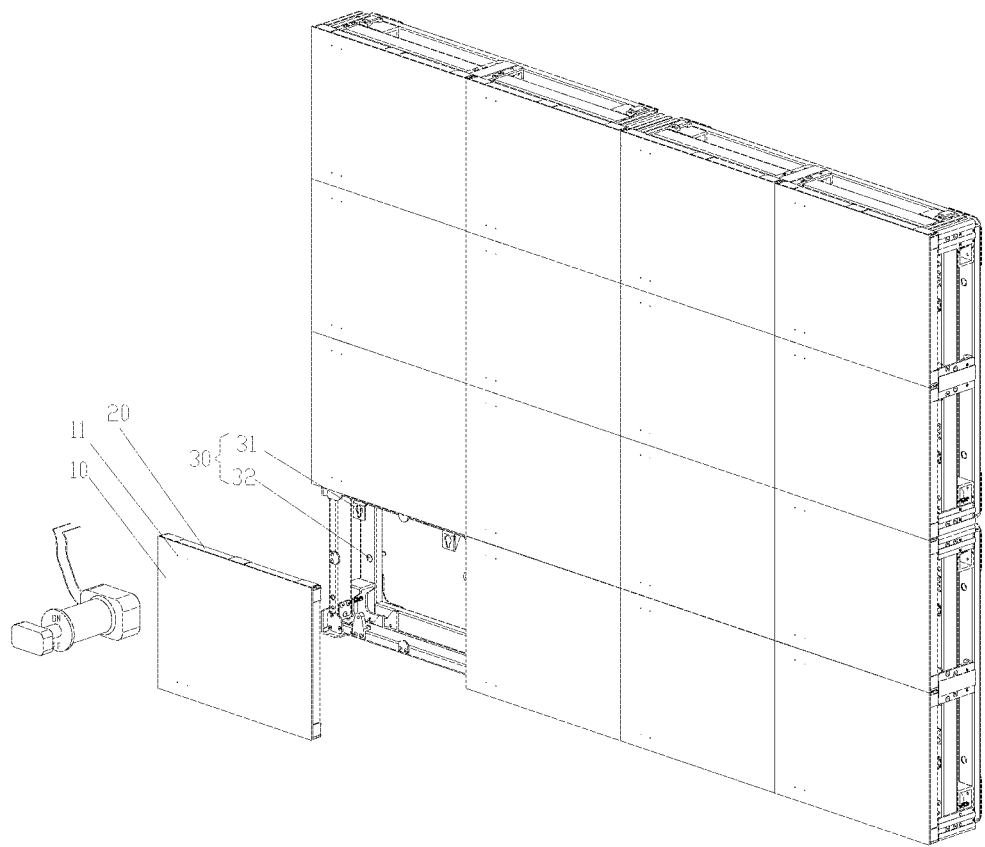
FIG. 3 shows a structural diagram of an embodiment for a display device according to the invention.

As shown in FIG. 1 to FIG. 3, in the technical solution of the present embodiment, an operation hole 11 running through the lamp panel 10 is provided on the lamp panel 10, such that an operation piece penetrating through the operation hole 11 can be connected with the reverse electromagnet 21 via a wire, thereby controlling whether the reverse electromagnet 21 is magnetic. A probe of a maintenance tool for a display screen stretches into the operation hole 11, and the magnetism of the reverse electromagnet 21 will disappear. In this case, the display screen assembly can be easily dismounted. Specifically, the operation hole 11 is provided on a front end face of the lamp panel 10. The structure is convenient to operate.

As shown in FIG. 1, in the technical solution of the present embodiment, the display screen assembly further comprises a plug connector provided at a position, corresponding to the operation hole 11, on the lamp panel 10, the wire is connected with the plug connector. The structure is easy to dismount and convenient to operate, and parts of the display screen assembly are not easily damaged.

As shown in FIG. 1, in the technical solution of the present embodiment, the fixed frame 20 is rectangular, there are four reverse electromagnets 21, and the four reverse electromagnets 21 are provided at four corners of the fixed frame 20 respectively. The display screen assembly with the structure is steady to fix, and is consistent in plane height.

As shown in FIG. 3, in the technical solution of the present embodiment, the display screen assembly further comprises a first ferromagnet (a ferromagnetic substance is called a ferromagnet comprising iron, cobalt, nickel and the like) provided at the rear side of the lamp panel 10. Specifically, a maintenance tool for the display screen is provided with a magnet, and the display screen assembly can be easily mounted or dismounted by means of an acting force of the magnet and the first ferromagnet 24. Further specifically, the first ferromagnet 24 is provided on the fixed frame 20 and is located between the fixed frame 20 and the lamp panel 10. The structure enables, on one hand, the first ferromagnet 24 to be easily provided, and ensures, on the other hand, a magnetic force between the maintenance tool for the display screen and the display screen assembly to be powerful enough. The first ferromagnet 24 is provided in a barycentre of the display screen assembly. The structure ensures that the action force between the maintenance tool for the display screen and the display screen assembly is located in the barycentre of the display screen assembly. The structure enables the display screen assembly to be evenly stressed. Preferably, the first ferromagnet is made from soft iron. The soft iron is low in price, which facilitates cost saving.

As shown in FIG. 1, in the technical solution of the present embodiment, the display screen assembly further comprises: a safety pin 22 and a positioning pin 23. The safety pin 22 comprises a rod body 221 and a stop portion 222 provided at a first end of the rod body 221, a second end of the rod body 221 is connected with the fixed frame 20. The safety pin 22 can prevent, on one hand, the display screen assembly from falling down from a fixture to cause a danger, and achieves, on the other hand, a coarse positioning function. A first end of the positioning pin 23 is connected with the fixed frame 20, a second end of the positioning pin 23 is conical structurally, the positioning pin 23 accurately positions the lamp panel 10, and the conical structure of the second end of the positioning pin 23 enables the positioning pin 23 to easily enter the fixture so as to be accurately positioned. Specifically, there are a plurality of positioning pins 23. The structure ensures, on one hand, accurate positioning of the display screen assembly, and ensures, on the other hand, that the display screen assembly will not shift after being positioned. A length of the safety pin 22 is longer than a length of the positioning pin 23. Specifically, during mounting, the safety pins 22 are in mounting fit with safety pin holes in a rear support, and then the whole display screen assembly is horizontally pushed to the rear support. In this case, the positioning pins 23 can be accurately inserted into positioning pin holes in the support. The structure ensures the reliable mounting and accurate positioning of the display screen assembly.

As shown in FIG. 1, in the technical solution of the present embodiment, the length of the safety pin 22 is greater than a thickness sum of the lamp panel 10 and the fixed frame 20. When the display screen assembly is mounted, the safety pin hole matched with the safety pin is easily seen by eyes, such that the display screen assembly can be inductively mounted by means of the fit between the safety pin and the safety pin hole.

The invention also provides a display device. The display device according to the invention comprises: a support and a display screen assembly connected with the support. The display screen assembly is the above display screen assembly, and a second ferromagnet corresponding to the reverse electromagnet 21 is provided on the support 30. The structure ensures that the display screen assembly and the support 30 are fixed by means of a magnetic force. Specifically, the second ferromagnet is made from iron. The iron is low in price, which facilitates cost saving.

As shown in FIG. 3, in the technical solution of the present embodiment, the support 30 further comprises: a safety pin hole 31 and a positioning pin hole 32. The safety pin hole 31 comprises a first hole and a second hole connected with each other, the first hole is provided at a lower side of the second hole, the first hole is adaptive to a rod body 221 of the display screen assembly and stops the passage of a stop portion 222 of the display screen assembly, and the second hole can allow the passage of the stop portion 222 of the display screen assembly. During mounting, the safety pin 22 passes through the second hole, and then the display screen assembly is moved down, such that the rod body 221 of the safety pin 22 penetrate into the first hole, the first end of the safety pin 22 is locked on a fixed frame 20, and the second end of the safety pin is provided at the rear side of the fixed frame 20. The cross sectional area of the stop portion 222 is larger than the area of the second hole, such that the stop portion 222 cannot penetrate out of the second hole, thereby safely protecting a lamp panel. The positioning pin hole 32 is adaptive to the positioning pin 23 of the display screen assembly. A conical structure of the positioning pin 23 easily enters the positioning pin hole 32, and the positioning pin 23 completely penetrates into the positioning pin hole 32. Due to the fact that the positioning pin hole 32 and the positioning pin 23 are adaptive, the positioning pin 23 can accurately position the lamp panel, thereby ensuring that the display screen assembly can be accurately mounted at a pre-determined position.

As shown in FIG. 1 and FIG. 3, under the conditions that the display screen assembly is mounted by being attached to a wall and there is no maintenance passage behind the display screen assembly, the display screen assembly is maintained from the front. A plurality of display screen assemblies are combined into an entire large display screen in a building block type splicing manner. The display screen assembly can be positioned by means of the safety pin 22 and positioning pin 23 on the fixed frame 20 and the corresponding safety pin hole 31 and positioning pin hole 32 on the support 30, at least one group of reverse electromagnets 21 which demagnetize when being powered on and magnetize when being powered off is provided on the display screen assembly, the reverse electromagnets 21 are connected to the lamp panel 10 via plug connectors, and needed electric energy is supplied by a power supply on a maintenance tool for the display screen via two probes. A rear cover 40 is connected with the fixed frame 20 via a quick mounting lock. When the probes are taken down to power the reverse electromagnets 21 off, the reverse electromagnets 21 generate a strong attraction force to be tightly attracted to an iron sheet on the support 30; and when it is necessary to maintain a certain display screen assembly, the maintenance tool for the display screen is attracted to the display screen assembly to be maintained, two probes are inserted into two operation holes 11 in the display screen assembly respectively, and a switch knob is adjusted to 'ON'. In this case, the reverse electromagnets 21 are energized to demagnetize, and the display screen assembly can be easily taken down using the maintenance tool for the display screen. All components needing to be maintained, comprising the display screen assembly with the structure, the power supply and a control panel, can be maintained from the front.

The above is only the preferred embodiments of the invention, and is not used to limit the invention. There can be various modifications and variations in the invention for those skilled in the art. Any modifications, equivalent replacements, improvements and the like within the spirit and principle of the invention shall fall within the protective scope of the invention.

The invention claimed is:

1. A display screen assembly, comprising:
 a lamp panel (10);
 a reverse electromagnet (21) provided at a rear side of the lamp panel (10);
 a fixed frame (20), wherein the lamp panel (10) and the reverse electromagnet (21) are provided on the fixed frame (20) separately, and the lamp panel (10) and the reverse electromagnet (21) are provided at two opposite sides of the fixed frame (20) respectively;
 an operation hole (11) running through the lamp panel (10) is provided on the lamp panel (10), such that an operation piece penetrating through the operation hole (11) can be connected with the reverse electromagnet (21) via a wire, thereby controlling whether the reverse electromagnet (21) is magnetic; and
 a needed electric energy of the reverse electromagnet (21) is supplied by a power supply on a maintenance tool for the display screen via two probes of the operation piece.

2. The display screen assembly according to claim 1, further comprising a plug connector provided at a position, corresponding to the operation hole (11), on the lamp panel (10), the wire is connected with the plug connector.

3. The display screen assembly according to claim 1, wherein the fixed frame (20) is rectangular, there are four reverse electromagnets (21), and the four reverse electromagnets (21) are provided at four corners of the fixed frame (20) respectively.

4. A display device, comprising: a support (30) and a display screen assembly connected with the support (30), wherein the display screen assembly is the display screen assembly according to claim 3, and
 a second ferromagnet corresponding to the reverse electromagnet (21) is provided on the support (30).

5. The display screen assembly according to claim 1, further comprising a first ferromagnet (24) provided at the rear side of the lamp panel (10).

6. The display screen assembly according to claim 5, wherein the first ferromagnet (24) is provided on the fixed frame (20) and is located between the fixed frame (20) and the lamp panel (10).

7. A display device, comprising: a support (30) and a display screen assembly connected with the support (30), wherein the display screen assembly is the display screen assembly according to claim 5, and
 a second ferromagnet corresponding to the reverse electromagnet (21) is provided on the support (30).

8. The display screen assembly according to claim 6, wherein the first ferromagnet (24) is provided in a geometric centre of the lamp panel (10).

9. The display screen assembly according to claim 8, wherein the first ferromagnet (24) is made from soft iron.

10. The display screen assembly according to claim 1, further comprising:
a safety pin (22), the safety pin (22) comprising a rod body (221) and a stop portion (222) provided at a first end of the rod body (221), and a second end of the rod body (221) is connected with the fixed frame (20); and
a positioning pin (23), a first end of the positioning pin (23) is connected with the fixed frame (20), and a second end of the positioning pin (23) is conical structurally,
a length of the safety pin (22) is longer than a length of the positioning pin (23).

11. The display screen assembly according to claim 10, wherein the length of the safety pin (22) is greater than a thickness sum of the lamp panel (10) and the fixed frame (20).

12. The display screen assembly according to claim 11, wherein there are a plurality of positioning pins (23).

13. A display device, comprising: a support (30) and a display screen assembly connected with the support (30), wherein the display screen assembly is the display screen assembly according to claim 10, and
a second ferromagnet corresponding to the reverse electromagnet (21) is provided on the support (30).

14. A display device, comprising: a support (30) and a display screen assembly connected with the support (30), wherein the display screen assembly is the display screen assembly according to claim 1, and
a second ferromagnet corresponding to the reverse electromagnet (21) is provided on the support (30).

15. The display device according to claim 14, wherein the display screen assembly is the display screen assembly according to claim 10, and the support (30) further comprises:
a safety pin hole (31), the safety pin hole (31) comprising a first hole and a second hole connected with each other, the first hole is provided at a lower side of the second hole, the first hole is adaptive to a rod body (221) of the display screen assembly and stops the passage of a stop portion (222) of the display screen assembly, and the second hole is capable of allowing the passage of the stop portion (222) of the display screen assembly; and
a positioning pin hole (32), the positioning pin hole (32) is adaptive to a positioning pin (23) of the display screen assembly.

16. The display device according to claim 14, wherein the second ferromagnet is made from iron.

* * * * *